| United States Patent [19] | [11] Patent Number: 4,797,653 |
|---|---|
| Takayama | [45] Date of Patent: Jan. 10, 1989 |

[54] DPCM ENCODER

[75] Inventor: Makoto Takayama, Kawasaki, Japan

[73] Assignee: Canon Kabushiki Kaisha, Tokyo, Japan

[21] Appl. No.: 938,268

[22] Filed: Dec. 5, 1986

[30] Foreign Application Priority Data

Dec. 26, 1985 [JP] Japan ................. 60-292159

[51] Int. Cl.$^4$ ............................................. H03M 3/04
[52] U.S. Cl. .................................. 341/51; 332/11 D; 375/27; 341/67
[58] Field of Search ................. 332/11 D; 375/27-33; 340/347 AD, 347 M

[56] References Cited

U.S. PATENT DOCUMENTS 4,168,513  9/1979  Hains et al. ........................ 358/261
4,542,516  9/1985  Weirich ..................... 340/347 CC X
4,592,070  5/1986  Chow et al. ................. 332/11 D X Primary Examiner—T. J. Sloyan
Attorney, Agent, or Firm—Robin, Blecker & Daley

[57] ABSTRACT

The predictive coder of the present invention is an apparatus for converting data into variable-length codes and outputting them, in which a differential data item is calculated from an input information data item and a predictive data item, a subsequent predictive data item is calculated using the quantized differential data item obtained by quantizing the differential data item, and coding is performed in such a manner that quantized differential data item indicating a data value having the maximum frequency of occurrence of quantized differential data items is coded as a code having a shortest length.

5 Claims, 2 Drawing Sheets

FIG.3

| $X(n)-\hat{X}(n)$ | $Q\{X(n)-\hat{X}(n)\}$ | $Y(n)$ | $X(n)-\hat{X}(n)$ | $Q\{X(n)-\hat{X}(n)\}$ | $Y(n)$ |
|---|---|---|---|---|---|
| 0 | 0 | 000 | −1 | −1 | 100 |
| 1 | 1 | 001 | −2 ~ −3 | −3 | 101 |
| 2 ~ 3 | 3 | 010 | −4 ~ −6 | −5 | 11100000 |
| 4 ~ 6 | 5 | 011 | −7 ~ −10 | −8 | 11110000 |
| 7 ~ 10 | 8 | 110 | −11 ~ −14 | −12 | 11110001 |
| 11 ~ 14 | 12 | 11100001 | −15 ~ −20 | −17 | 11110010 |
| 15 ~ 20 | 17 | 11100010 | −21 ~ −26 | −23 | 11110011 |
| 21 ~ 26 | 23 | 11100011 | −27 ~ −35 | −30 | 11110100 |
| 27 ~ 35 | 30 | 11100100 | −36 ~ −44 | −39 | 11110101 |
| 36 ~ 44 | 39 | 11100101 | −45 ~ −55 | −49 | 11110110 |
| 45 ~ 55 | 49 | 11100110 | −56 ~ −68 | −61 | 11110111 |
| 56 ~ 68 | 61 | 11100111 | −69 ~ −81 | −74 | 11111000 |
| 69 ~ 81 | 74 | 11101000 | −82 ~ −96 | −88 | 11111001 |
| 82 ~ 96 | 88 | 11101001 | −97 ~ −112 | −104 | 11111010 |
| 97 ~ 112 | 104 | 11101010 | −113 ~ −130 | −121 | 11111011 |
| 113 ~ 130 | 121 | 11101011 | −131 ~ −148 | −139 | 11111100 |
| 131 ~ 148 | 139 | 11101100 | −149 ~ −168 | −158 | 11111101 |
| 149 ~ 168 | 158 | 11101101 | −169 ~ −188 | −178 | 11111110 |
| 169 ~ 188 | 178 | 11101110 | −189 ~ −255 | −198 | 11111111 |
| 189 ~ 255 | 198 | 11101111 | | | |

DPCM ENCODER

BACKGROUND OF THE INVENTION

1. Field of the Invention

The present invention relates to a predictive coder for outputting data signals which have been subjected to variable-length coding.

2. Description of the Related Art

In conventionally known DPCM (Differential Pulse Code Modulation), when an image signal is subjected to predictive coding using a predictive coder and is output as variable-length codes, since there is a certain correlation between items of sampling data, it is assumed that the frequency of occurrence of the DPCM signal at "0" is a maximum, a signal having the shortest code length is assigned to the "0" value DPCM signal, and, as the frequency of occurrence of data values decreases, signals having larger code lengths are assigned to those values.

However, in this case, when the coefficient of a predictive filter which determines a predictive value is not "1", the frequency of occurrence of predictive differential signals at "0" is not a maximum. Namely, the graph of the frequencies of occurrence of the values of each predictive differential signal is not a normal distribution with its center at "0", as shown in FIG. 2.

As a result, a conventional apparatus, in which a signal having the shortest code length is given to the center point at which each predictive differenctial signal is "0", has a disadvantage with respect to a poor data compression efficiency.

SUMMARY OF THE INVENTION

An object of the present invention is to provide a predictive coder which is capable of solving the above-described problem.

Another object of the present invention is to provide a predictive coder which exhibits a high data compression efficiency during predictive coding.

To realize the above objects, the present invention presents, as an embodiment, a predictive coder for converting data into variable-length codes and outputting them, comprising: differential data calculating means for calculating a differential data item from an input information data item and a predictive data item; quantizing means for quantizing the differential data item calculated by the differential data calculating means and outputting the quantized differential data item; predictive data generating means for calculating a predictive data item, using the quantized differential data item output from the quantizing means, and supplying it to the differential data calculating means; and coding means for coding in such a manner that, of the quantized differential data items output from the quantizing means, those data items indicating a data value having the maximum frequency of occurrence are coded by a signal having the shortest code length.

A further object of the present invention is to provide a predictive coder which is capable of providing adaptive coding by coding in correspondence to the frequency of occurrence of a data value indicated by a quantized differential data item during predictive coding.

To realize this object, the present invention provides, as an embodiment, a predictive coder for coding data and then outputting it, comprising: differential data calculating means for calculating a differential data item from an input information data item and a predictive data item; quantizing means for quantizing the differential data item calculated by the differential data calculating means and outputting the quantized differential data item; predictive data generating means for calculating a predictive data item, using the quantized differential data item output from the quantizing means, and supplying it to the differential data calculating means; and coding means for coding the quantized differential data item in correspondence to the frequency of occurrence of the data value indicated by the quantized differential data item output from the quantizing means.

Other objects and the characteristics of the present invention will be made clear in the following detailed description of an embodiment, with reference to the drawings.

BRIEF DESCRIPTION OF THE DRAWINGS

FIG. 3 is a table of the relationships between data items of this embodiment.

DETAILED DESCRIPTION OF THE PREFERRED EMBODIMENTS

Figure 1:
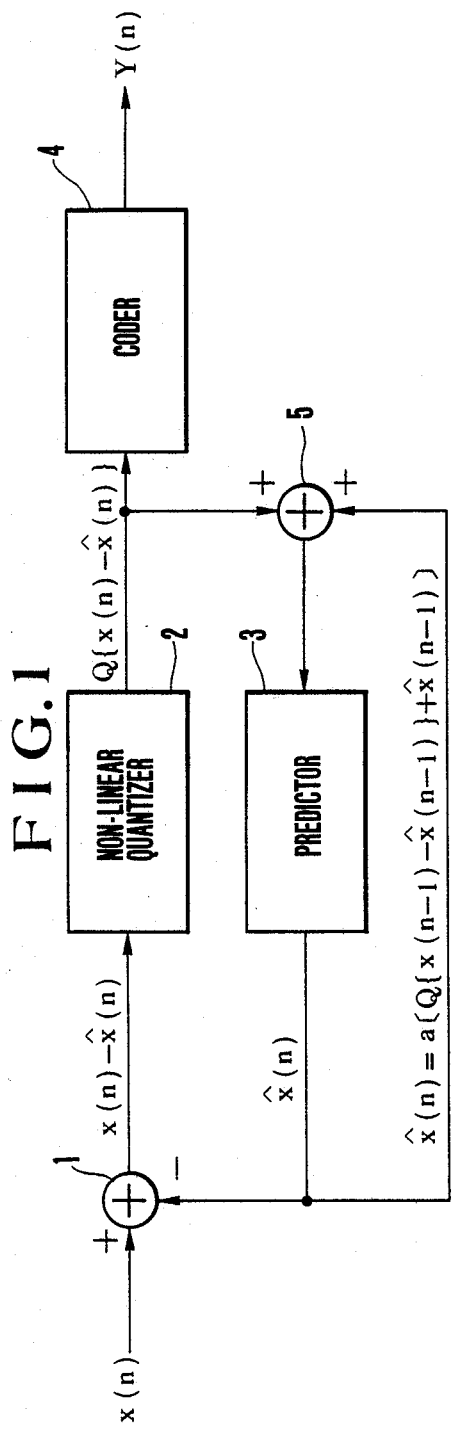
FIG. 1 is a block diagram of an embodiment of a predictive coder to which the present invention is applied.

FIG. 1 is a block diagram of an embodiment of a predictive coder to which the present invention is applied. In this drawing, reference number 1 denotes a digital subtracter which subtracts a predictive data item $\hat{X}(n)$ from an input data item $X(n)$ and outputs a differential data item $X(n) - \hat{X}(n)$; reference number 2 denotes a non-linear quantizer which performs a non-linear quantization of the differential data item and outputs a central value data item $Q\{X(n) - \hat{X}(n)\}$; reference number 3 denotes a predictor provided with a linear predictive filter, described below, and which outputs the predictive data item $\hat{X}(n)$; reference number 4 denotes a coder which codes the central value data item from the non-linear quantizer 2 into a variable-length code to produce an output data item $Y(n)$; and reference number 5 denotes a digital adder which adds the central value data item to the predictive data item.

The output data item from the digital adder 5 is $Q\{X(n) - \hat{X}(n)\} + \hat{X}(n)$.

The above-described linear predictive filter outputs the predictive data item $\hat{X}(n) = a[Q\{X(n-1) - \hat{X}(n-1)\} + \hat{X}(n-1)]$, wherein "a" is a coefficient less than 1.

Figure 2:
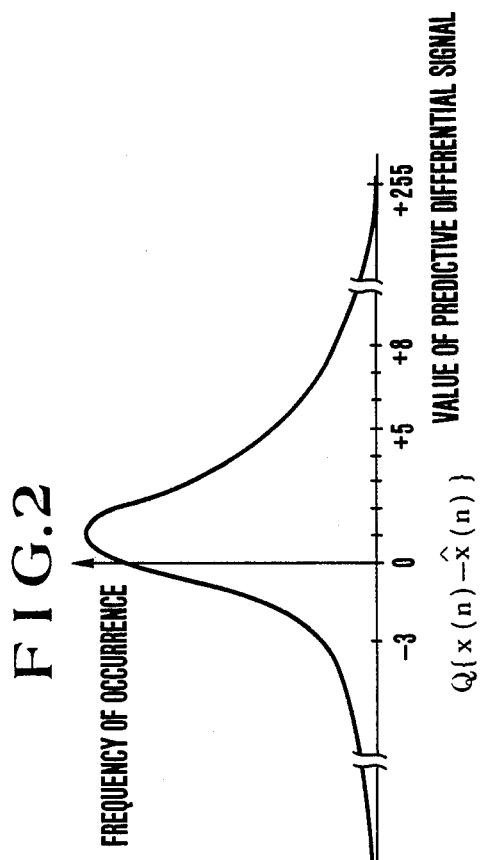
FIG. 2 is a graph of the frequencies of occurrence of the central value data items in this embodiment.

FIG. 2 is a graph of the frequencies of occurrence of the central value data items which are the output from the non-linear quantizer 2. This graph shows a distribution curve obtained on the basis of various image data items, and determines the maximum frequency of occurrence for a central value which is not "0". This is caused by the coefficient "a", which is less than 1, of the predictive filter and positive values of the outputs from the digital subtracter 1 (differential data).

Therefore, in order to code the central value data item obtained from the non-linear quantizer 2 into a variable-length code, it is preferable to determine the code length by centering the data item having the maximum frequency of occurrence shown in FIG. 2 ("1" in this embodiment).

FIG. 3 is a table of the relationships between output data items Y(n) coded by this embodiment and differential data items and central data items. In this embodiment, 3 bits are assigned to data items in the range of +8 to −3, and 8 bits are assigned to other central value data items, around the center at which the central value data item $Q\{X(n)-\hat{X}(n)\}$ is 1.

It has been found from an examination of the outputs of actual coding that, amongst all data comprising 39 steps, central value data items (+8 to −3) which have been coded into 3-bit codes occupy 80 to 90 percent of the data. In other words, this embodiment makes it possible to transmit all data comprising 39 steps as data with an average word length of 4 bits.

Although the central value data is expressed by variable-length words with 3 bits/8 bits in the above embodiment, it is also possible to express it by variable-length words such as Huffman codes.

In the above embodiment, variable-length coding is conducted with respect to so-called pre-prediction DPCM which is the simplest mode of predictive coding modes, but the present invention may be of course applied to other coding modes.

As described above, the present invention makes it possible to provide a predictive coder which exhibits a high data compression efficiency during predictive coding.

What is claimed is:

1. A predictive encoder for converting data to variable-length codes and outputting them, comprising:
    (A) differential data calculating means for calculating a differential data from an input information data and a predictive data;
    (B) quantizing means for quantizing said differential data calculated by said differential data calculating means and outputting a quantized differential data;
    (C) predictive data generating means for calculating said predictive data using said quantized differential data output from said quantizing means, and supplying it to said differential data calculating means; and
    (D) encoding means for outputting coded data having code lengths corresponding to values of the quantized differential data output of said quantizing means, said encoding means assigning code lengths to the coded data in which assigned code lengths at the +side of values of the quantized differential data and assigned code lengths at the −side thereof are symmetric relative to a center of the quantized differential data which is other than "0".

2. A predictive encoder according to claim 1, wherein said predictive data generating means comprises:
    (A) addition means for adding said quantized differential data output from said quantizing means to said predictive data and outputting it; and
    (B) predictive means for multiplying the addition result output from said addition means by "a" (where "a" is a real number and 0<a<1), outputting the result of such multiplication with a delay of a period corresponding to one data and supplying it to said addition means and said differential data calculating means.

3. An apparatus according to claim 1, wherein said quantizing means subjects said differential data calculated by said differential data calculating means to non-linear quantization.

4. A predictive encoder for converting data to variable-length codes and outputting them, comprising:
    (A) differential data calculating means for calculating a differential data from an input information data and a predictive data;
    (B) quantizing means for quantizing said differential data calculated by the differential data calculating means and outputting a quantized differential data;
    (C) predictive data generating means for calculating said predictive data , using the quantized differential data output from said quantizing means, and supplying it to said differential data calculating means; and
    (D) coding means for outputting coded data having code lengths corresponding to values of the quantized differential data output of said quantizing means, said encoding mans assigning code lengths to the coded data in which assigned code lengths at the +side of values of the quantized differential data and assigned code lengths at the −side thereof are symmetric relative to a center of a first quantized differential data value which is other than "0", wherein first code lengths are assigned in a range of quantized differential data between a second value and a third value, said second value being near said first value and the absolute value of said third value being greater than the absolute value of said second value, and wherein second code lengths are assigned outside of said range, said first code lengths being shorter than said second code lengths.

5. A predictive encoder according to claim 4, wherein said predictive data generating means comprises:
    (A) addition means for adding said quantized differential data output from said quantizing means to said predictive data and outputting it; and
    (B) predictive means for multiplying the addition result output from said addition means by "a" (where "a" is a real number and 0<a<1), outputting the result of such multiplication with a delay of a period corresponding to one data and supplying it to said addition means and said differential data calculating means.

* * * * *